United States Patent

Greslehner-Nimmervoll et al.

(10) Patent No.: US 10,859,674 B2
(45) Date of Patent: Dec. 8, 2020

(54) RADAR FRONT END WITH RF OSCILLATOR MONITORING

(71) Applicant: Infineon Technologies AG, Neubiberg (DE)

(72) Inventors: Bernhard Greslehner-Nimmervoll, Hagenberg im Mühlkreis (AT); Georg Krebelder, Ottensheim (AT); Jochen O. Schrattenecker, Reichenthal (AT)

(73) Assignee: Infineon Technologies AG

(*) Notice: Subject to any disclaimer, the term of this patent is extended or adjusted under 35 U.S.C. 154(b) by 252 days.

(21) Appl. No.: 16/014,044

(22) Filed: Jun. 21, 2018

(65) Prior Publication Data

US 2018/0372843 A1 Dec. 27, 2018

(30) Foreign Application Priority Data

Jun. 21, 2017 (DE) .................. 10 2017 113 730

(51) Int. Cl.
*G01S 7/40* (2006.01)
*G01S 13/34* (2006.01)
(Continued)

(52) U.S. Cl.
CPC .......... *G01S 7/4056* (2013.01); *G01S 7/4008* (2013.01); *G01S 7/4017* (2013.01); *G01S 13/342* (2013.01); *G01S 13/343* (2013.01); *G01S 13/931* (2013.01); *H03C 3/095* (2013.01); *H03C 3/0925* (2013.01); *H03C 3/0941* (2013.01); *H03L 7/06* (2013.01);
(Continued)

(58) Field of Classification Search
CPC ........ G01R 31/3167; G01R 31/318516; G01R 31/2824; G01R 31/2843; G01R 31/31727; G01R 35/00; H03L 7/143; H03L 7/145; H03L 7/146; H03L 7/06; H03L 7/18; H03L 7/193; H03L 7/08; H03L 2207/50; G01S 13/342; G01S 7/032; G01S 7/4008; G01S 7/4017; G01S 7/4056; G01S 13/34; H03C 3/0925

See application file for complete search history.

(56) References Cited

U.S. PATENT DOCUMENTS 5,381,085 A * 1/1995 Fischer ................ G01R 31/316
324/76.48
5,886,536 A * 3/1999 Tsuruki ............ G01R 31/31709
324/762.01

(Continued)

FOREIGN PATENT DOCUMENTS

DE         19813604 A1    9/1999
DE      102015120733 A1    6/2017

*Primary Examiner* — Olumide Ajibade Akonai
(74) *Attorney, Agent, or Firm* — Design IP

(57) ABSTRACT

An apparatus is described that, according to an exemplary embodiment, has an RF oscillator for generating an RF oscillator signal at a first frequency and a frequency divider having a division ratio that is fixed during operation. The frequency divider is supplied with the RF oscillator signal and is configured to provide an oscillator signal at a second frequency. The apparatus further has a monitor circuit, to which the oscillator signal at the second frequency is supplied and which is configured to measure the second frequency and to provide at least one digital value that is dependent on the second frequency of the oscillator signal. The at least one digital value is provided on a test contact.

28 Claims, 5 Drawing Sheets

(51) Int. Cl.
  *G01S 13/931* (2020.01)
  *H03L 7/18* (2006.01)
  *H03L 7/06* (2006.01)
  *H03C 3/09* (2006.01)
  *H03L 7/193* (2006.01)
  *G01S 7/03* (2006.01)

(52) U.S. Cl.
  CPC ............... *H03L 7/18* (2013.01); *H03L 7/193* (2013.01); *G01S 7/032* (2013.01)

(56) References Cited

U.S. PATENT DOCUMENTS

| | | | |
|---|---|---|---|
| 6,396,889 B1 * | 5/2002 | Sunter | H03L 7/08 375/376 |
| 6,486,857 B1 * | 11/2002 | Esaki | G09G 1/04 345/13 |
| 6,856,794 B1 * | 2/2005 | Tso | G01S 19/18 330/302 |
| 7,400,130 B2 * | 7/2008 | Naujokat | G01R 31/31724 324/76.48 |
| 7,859,346 B2 * | 12/2010 | Lam | H03L 7/18 327/156 |
| 9,594,100 B2 * | 3/2017 | Khan | G01R 23/02 |
| 10,732,293 B2 * | 8/2020 | Wentzloff | G01S 19/37 |
| 2006/0158262 A1 * | 7/2006 | Robinson | H03L 7/0891 331/16 |
| 2007/0279135 A1 * | 12/2007 | Hull | H03L 7/081 331/1 A |
| 2011/0163815 A1 * | 7/2011 | Bellaouar | H03C 3/0933 331/10 |
| 2014/0145874 A1 * | 5/2014 | von Rhein | G01S 7/40 342/174 |
| 2017/0153318 A1 | 6/2017 | Melzer et al. | |
| 2018/0188317 A1 * | 7/2018 | Maiellaro | G01R 31/2884 |
| 2019/0334534 A1 * | 10/2019 | Kitamura | H04B 1/0028 |

* cited by examiner

RADAR FRONT END WITH RF OSCILLATOR MONITORING

FIELD

The present disclosure relates to the field of radio-frequency (RF) circuits. Some exemplary embodiments relate to a radar front end having an RF oscillator and a monitoring circuit for checking the operation of the RF oscillator.

BACKGROUND

Radio-frequency (RF) transmitters and receivers are found in a multiplicity of applications, particularly in the field of wireless communication and radar sensors. In the automotive sector, there is an increasing need for radar sensors, which are used in what are known as adaptive cruise control (ACC, or radar cruise control) systems. Such systems can automatically adapt the speed of an automobile so as to keep a safe distance from other automobiles traveling ahead (and from other objects and from pedestrians). Further applications in the automotive sector are e.g. blind spot detection, lane change assist and the like.

Modern radar systems use large-scale integrated RF circuits that can combine all the core functions of an RF front end of a radar transceiver in a single package (single-chip radar transceiver), this frequently being referred to as an MMIC (monolithic microwave integrated circuit). Such RF front ends usually contain, inter alia, a voltage-controlled oscillator (VCO) connected in a phase locked loop, power amplifiers (PA), directional couplers, mixers and analog-to-digital convertors (ADC), and also associated control circuit arrangements for controlling and monitoring the RF front end. Radar applications used in automobiles are subject to various standards relating to safety in road traffic, for example, the functional safety standard ISO 26262 entitled "Road *vehicles—Functional safety*". In order to ensure the functional safety of a radar sensor and/or to meet legal regulations, the RF front end should operate with well-defined operating parameters.

It would be desirable to provide an integrated radar system having improved self-test or self-monitoring capabilities.

SUMMARY

The aforementioned object may be achieved by the apparatus according to one or more described embodiments. Various embodiments and further developments are the subject of the claims.

An apparatus is described that, according to an exemplary embodiment, has an RF oscillator for generating an RF oscillator signal at a first frequency and a frequency divider having a division ratio that is fixed during operation. The frequency divider is supplied with the RF oscillator signal and is configured to provide an oscillator signal at a second frequency. The apparatus further has a monitor circuit, to which the oscillator signal at the second frequency is supplied and which is configured to measure the second frequency and provide at least one digital value that is dependent on the second frequency of the oscillator signal. The at least one digital value is provided on at least one test contact.

Moreover, a method is described that, according to an exemplary embodiment, involves the following: actuating a voltage-controlled RF oscillator such that it generates an RF oscillator signal at a first frequency; generating an oscillator signal at a second frequency, from the first RF oscillator signal, by means of a frequency divider having a division ratio that is fixed during operation; measuring the second frequency and providing at least one digital value that is dependent on the second frequency of the oscillator signal; and providing the at least one digital value on at least one test contact.

Furthermore, a monolithic microwave integrated circuit (MMIC) is described. According to an exemplary embodiment, the MMIC has an RF oscillator, integrated in a semiconductor chip, for generating an RF oscillator signal at a first frequency. The semiconductor chip further incorporates a frequency divider having a division ratio that is fixed during operation. The frequency divider is supplied with the RF oscillator signal and is configured to provide an oscillator signal at a second frequency. The MMIC further has a monitor circuit, integrated in the semiconductor chip, to which the oscillator signal at the second frequency is supplied and which is configured to measure the second frequency and provide at least one digital value that is dependent on the second frequency of the oscillator signal. The at least one digital value is provided on a test contact arranged on the semiconductor chip.

BRIEF DESCRIPTION OF THE DRAWINGS

The invention is explained in more detail below on the basis of the examples depicted in the figures. The depictions are not necessarily to scale and the invention is not restricted only to the depicted aspects. Rather, emphasis is placed on depicting the principles on which the invention is based. In the figures.

DETAILED DESCRIPTION

The exemplary embodiments that now follow are described within the context of a radar receiver. The invention is not restricted to radar applications, however, and can also be employed in other areas, for example in RF transceivers of RF communication apparatuses. RF circuits from a wide variety of areas of application can have voltage-controlled oscillators (VCOs) for generating RF signals. Instead of VCOs, it is alternatively also possible for digitally controlled oscillators (DCOs) to be used. The concepts that are now described can easily be transferred without hesitation to applications in which DCOs instead of VCOs are used.

Figure 1:
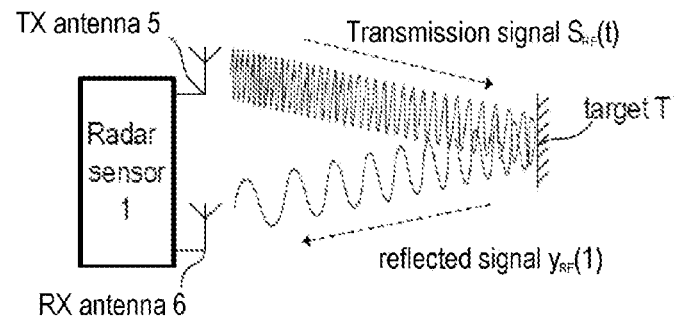
FIG. 1 shows a sketch to illustrate the functional principle of a frequency-modulated continuous wave radar system (FMCW) radar system for distance and/or speed measurement.

FIG. 1 illustrates the application of a frequency modulated continuous wave (FMCW) radar system as a sensor for measuring distances and speeds of objects, which are usually referred to as radar targets. In the present example, the radar apparatus 10 has separate transmission (TX) and reception (RX) antennas 5 and 6 (bistatic or pseudo-monostatic radar configuration). However, it should be noted that it is also possible for a single antenna to be used that simultaneously serves as a transmission antenna and a reception antenna (monostatic radar configuration). The transmission antenna 5 radiates a continuous RF signal $s_{RF}(t)$ that is frequency-modulated, for example by means of a sawtooth signal (periodic, linear ramp signal). The radiated signal $s_{RF}(t)$ is scattered back at the radar target T, and the backscattered (reflected) signal $y_{RF}(t)$ is received by the reception antenna 6.

Figure 2:
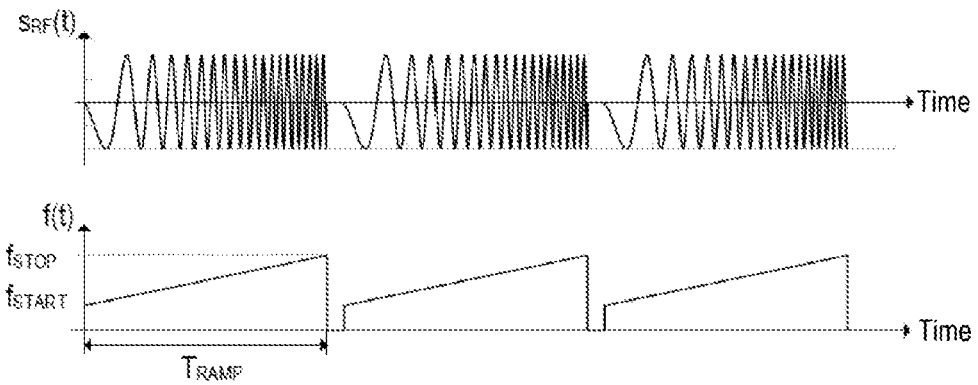
FIG. 2 includes two timing diagrams to illustrate the frequency modulation of the RF signal generated by the FMCW system.

FIG. 2 illustrates the aforementioned frequency modulation of the signal $s_{RF}(t)$ by way of example. As depicted in FIG. 2, the signal $s_{RF}(t)$ is composed of a set of "chirps", i.e. signal $s_{RF}(t)$ comprises a sequence of sinusoidal signal profiles (waveforms) at rising (up-chirp) or falling (down-chirp) frequency (see top diagram in FIG. 2). In the present example, the instantaneous frequency f(t) of a chirp rises linearly at a starting frequency $f_{START}$, beginning within a time period $T_{RAMP}$, to a stopping frequency $f_{STOP}$ (see bottom diagram in FIG. 2). Such chirps are also referred to as a linear frequency ramp. FIG. 2 depicts three identical linear frequency ramps. However, it should be noted that the parameters $f_{START}$, $f_{STOP}$, $T_{RAMP}$ and the pause between the individual frequency ramps can vary. The frequency variation also does not necessarily have to be linear. Depending on the implementation, it is also possible for transmission signals with exponential (exponential chirps) or hyperbolic (hyperbolic chirps) frequency variation to be used.

Figure 3:
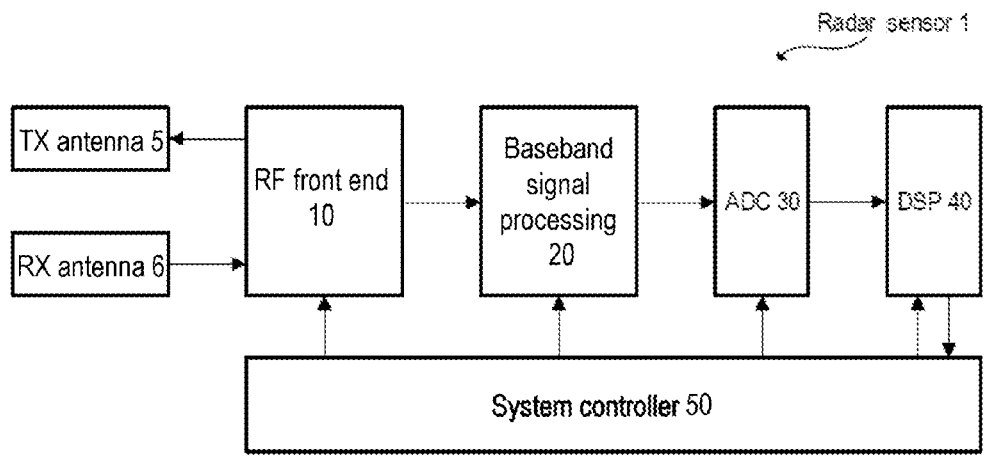
FIG. 3 is a block diagram to illustrate the basic structure of an FMCW radar system.

FIG. 3 is a block diagram depicting a possible structure of a radar apparatus 1 (radar sensor) by way of example. Similar structures can also be found e.g. in RF transceivers used in other applications, such as e.g. wireless communication systems. Accordingly, at least one transmission antenna 5 (TX antenna) and at least one reception antenna 6 (RX antenna) are connected to an RF front end 10, which can contain all those circuit components that are needed for the RF signal processing. These circuit components comprise, by way of example, a local oscillator (LO), RF power amplifiers, low noise amplifiers (LNA), directional couplers (e.g. rat-race couplers, circulators, etc.) and mixers for down-converting the RF signals to baseband or an intermediate frequency band (IF band). The RF front end 10 may—possibly together with further circuit components—be integrated in a monolithic microwave integrated circuit (MMIC). The example depicted shows a bistatic (or pseudo-monostatic) radar system having separate RX and TX antennas. In the case of a monostatic radar system, a single antenna (or an antenna array) would be used both for radiating and for receiving the electromagnetic (radar) signals. In this case, a directional coupler (e.g. a circulator) can be used to separate the RF signals to be radiated to the radar channel from the RF signals (radar echos) received from the radar channel.

In the case of a frequency-modulated continuous wave radar system (FMCW radar system), the RF signals radiated via the TX antenna 5 may be e.g. in the region of approximately 20 GHz and 81 GHz (e.g. 77 GHz in some applications). As mentioned, the RF signal received by the RX antenna 6 comprises the radar echos, i.e. those signal components that are scattered back at what are known as the radar targets. The received RF signal $y_{RF}(t)$ is e.g. down-converted to baseband and processed further in baseband by means of analog signal processing (see FIG. 3, analog baseband signal processing chain 20). The cited analog signal processing essentially comprises filtering and possibly amplification of the baseband signal. The baseband signal is finally digitized (see FIG. 3, analog-to-digital convertor 30) and processed further in the digital domain. The digital signal processing chain may be realized at least in part as software, which is executed on a processor (see FIG. 3, DSP 40). The entire system is normally controlled by means of a system controller 50, which may likewise be implemented at least in part as software that can be executed on a processor, such as e.g. a microcontroller. The RF front end 10 and the analog baseband signal processing chain 20 (optionally also the analog-to-digital convertor 30) may be jointly integrated in a single MMIC (i.e. an RF semiconductor chip). Alternatively, the individual components may also be distributed over multiple integrated circuits.

Figure 4:
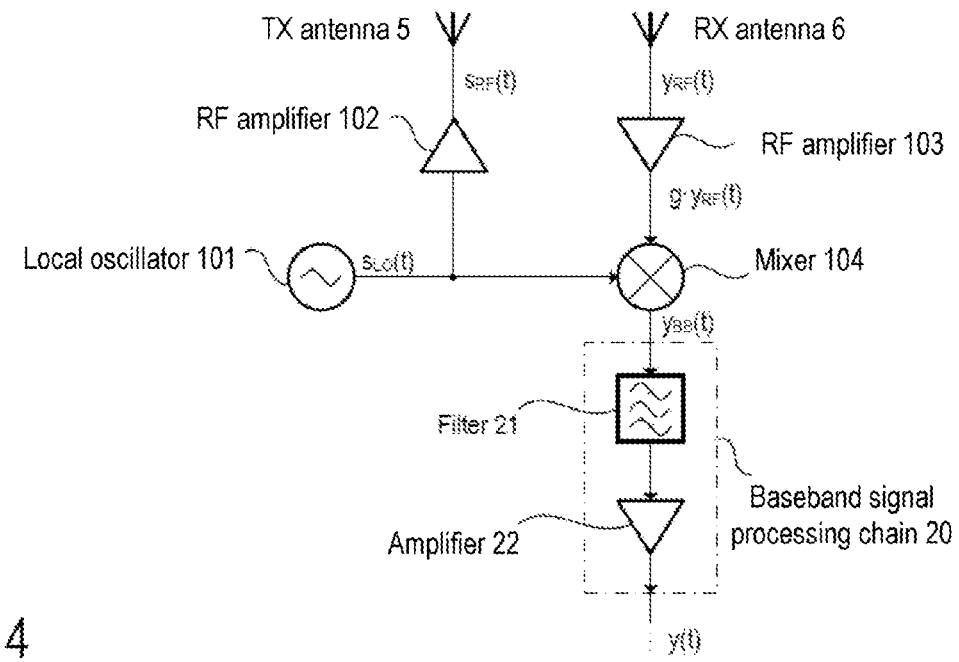
FIG. 4 is a block diagram to illustrate an example of an analog RF front end of the FMCW radar system from FIG. 3.

FIG. 4 illustrates an exemplary implementation of the RF front end 10 with a downstream baseband signal processing chain 20, these possibly being part of the radar sensor from FIG. 3. It should be noted that FIG. 4 depicts a simplified circuit diagram in order to show the basic structure of the RF front end. Actual implementations, which can be highly dependent on the specific application, may naturally be more complex. The RF front end 10 comprises a local oscillator 101 (LO) that generates an RF signal $s_{LO}(t)$. The signal $s_{LO}(t)$ may, as described above with reference to FIG. 3, be frequency-modulated and is also referred to as an LO signal. In radar applications, the LO signal is usually in the SHF (super high frequency, centimeter-wave) or in the EHF (extremely high frequency, millimeter-wave) band, e.g. in a range from 76 GHz to 81 GHz in automotive applications.

The LO signal $s_{LO}(t)$ is processed both in the transmission signal path and in the received signal path. The transmission signal $s_{RF}(t)$ (cf. FIG. 2) radiated by the TX antenna 5 is generated by amplifying the LO signal $s_{LO}(t)$, for example by means of the RF power amplifier 102. The output of the amplifier 102 may be coupled to the TX antenna 5 (in the case of a bistatic or pseudo-monostatic radar configuration). The received signal $y_{RF}(t)$ provided by the RX antenna 6 is supplied to the RF port of the mixer 104. In the present example, the RF received signals $y_{RF}(t)$ (antenna signal) is preamplified by means of the amplifier 103 (gain g), and the mixer 104 is supplied with the amplified RF received signal $g \cdot y_{RF}(t)$. The amplifier 103 may be e.g. an LNA. The reference port of the mixer 104 is supplied with the LO signal $s_{LO}(t)$, so that the mixer 104 down-converts the (preamplified) RF received signal $y_{RF}(t)$ to baseband. The down-converted baseband signal (mixer output signal) is denoted by $y_{BB}(t)$. This baseband signal $y_{BB}(t)$ is initially processed further in analog fashion, wherein the analog baseband signal processing chain 20 essentially has amplification (amplifier 22) and filtering (e.g. band pass filter 21), in order to reject undesirable side bands at image frequencies. The resulting analog output signal that can be supplied to an analog-to-digital convertor is denoted by y(t). Methods for digital further processing of the output signal (digital radar signal) are known per se (for example range doppler analysis) and are therefore not discussed further now.

In the present example, the mixer 104 down-converts the preamplified RF received signal g·$y_{RF}$(t) (i.e. the amplified antenna signal) to baseband. The mixing can take place in one stage (that is to say from the RF band directly to baseband) or via one or more intermediate stages (that is to say from the RF band to an intermediate frequency band and on to baseband). In view of the example shown in FIG. 4, it becomes clear that the quality of a radar measurement is highly dependent on the quality or accuracy of the LO signal $s_{LO}$(t). Depending on the application, radar sensors need to satisfy particular standards, for example the functional safety standard ISO 26262. To ensure the functional safety of a radar sensor and/or to meet legal regulations, the RF front end should operate with well defined operating parameters. In the case of the RF front ends integrated in MMICs (e.g. single-chip radar), tolerances can mean that measures are needed during production to check and calibrate particular parameters. During operation too, it would be desirable to be able to monitor relevant parameters (monitoring) and, in the event of an inadmissible alteration of one or more parameters, to signal an error in order to ensure that potentially unreliable measured values are detected as such.

Figure 5:
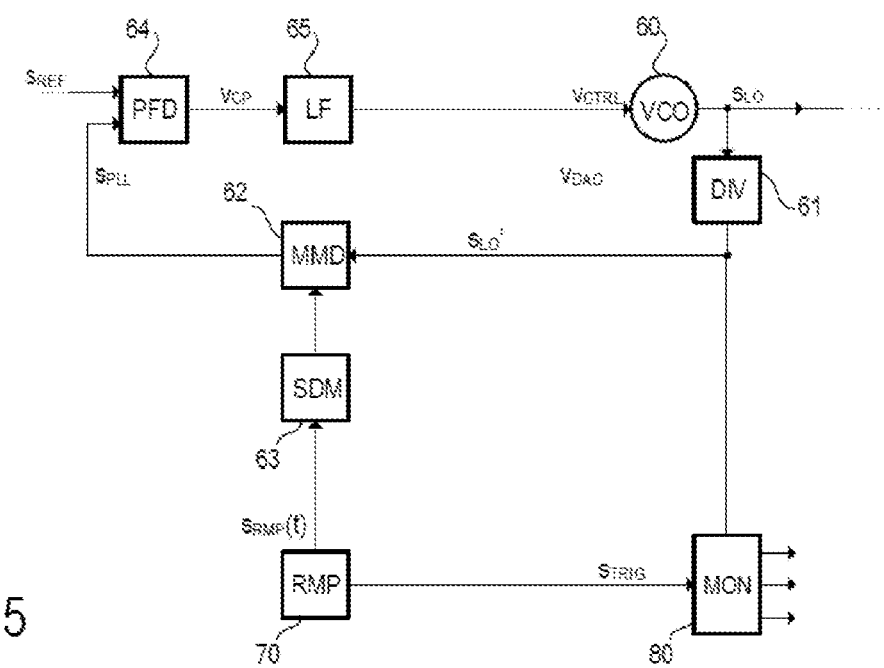
FIG. 5 is a block diagram for illustrating an example of a phase locked loop (PLL) for generating a frequency-modulated RF signal.

As mentioned above, the quality or accuracy of the LO signal $s_{LO}$(t) is relevant to the quality of a radar measurement. The LO signal $s_{LO}$(t) is normally generated by a voltage controlled oscillator (VCO). When monitoring the VCO, e.g. the absolute value and the linearity of the VCO parameter $k_{VCO}$ may be of interest. The VCO parameter $k_{VCO}$ describes the ratio between control voltage $V_{CTRL}$ of the VCO and the frequency $f_{LO}$ of the output signal $s_{LO}$(t), that is to say $k_{VCO}=f_{LO}/V_{CTRL}$. A VCO is usually operated in a phase locked loop (PLL). FIG. 5 shows a possible structure of a local oscillator (LO) with a VCO connected up in a PLL by way of example.

FIG. 5 shows a simplified circuit diagram that, by way of example, has the basic structure of a local oscillator comprising a PLL with a VCO. In the present example, the VCO 60 generates the RF oscillator signal $s_{LO}$(t), which may be e.g. in the EHF band. The frequency $f_{LO}$ of the RF oscillator signal $s_{LO}$(t) is dependent on the input voltage $V_{CTRL}$ (control voltage) of the VCO 60. Since the frequency $f_{LO}$ is too high for direct further processing, the VCO 60 has a downstream frequency divider 61 having a constant division ratio 1/M. The divisor M is an integer and may be e.g. 32. However, other values are also possible for M (e.g. 1, 2, 4, 6, 8, etc.). In the example of 1/M=1/32 mentioned, an oscillator frequency $f_{LO}$ of 80 GHz would be reduced to 2.5 GHz. The divisor M is constant during operation, that is to say that M does not change during operation. Nevertheless, M can be set to a desired value depending on the configuration of the RF front end. The frequency at the output of the frequency divider 61 is denoted by $f_{LO}'$ ($f_{LO}'=f_{LO}/M$); the reduced-frequency oscillator signal is denoted by $s_{LO}'$(t).

The frequency divider 61 has a downstream multi-modulus divider 62 (MMD) that is configured to reduce the frequency $f_{LO}'$ of the signal $s_{LO}'$(t) by a variable divisor N. The output signal of the multi-modulus divider 62 is denoted by $s_{PLL}$(t) and its frequency is denoted by $f_{PLL}$ ($f_{LO}'/N=f_{PLL}$). Continual variation of the division ratio 1/N of the multi-modulus divider 62 (e.g. by means of the sigma-delta modulator 63) can effectively produce a rational divisor. In this case, a desired rational divisor R is e.g. modulated by means of the sigma-delta modulator 63. At the output of the sigma-delta modulator 63, an updated integer divisor value N is generated for the multi-modulus divider 62 in each clock cycle. Effectively—on average—a rational divisor N is obtained. Such frequency divider circuits (MMD and modulator) are also referred to as fractional N dividers. The sigma-delta modulator can have e.g. a MASH (multi-stage noise shaping) structure.

The output signal $s_{PLL}$(t) of the multi-modulus divider 62 and a reference signal $s_{REF}$(t) (frequency $f_{REF}$) are supplied to a phase detector (PD) or phase-frequency detector (PFD) 64 configured to compare the phases (or phases and frequencies) of the signals $s_{PLL}$(t) and $s_{REF}$(t). The output signal $V_{CP}$ of the phase-frequency detector 64 is dependent on the detected phase and/or frequency difference. Usually, the output stage of a phase-frequency detector comprises a charge pump. Various implementations of phase detectors and phase-frequency detectors are known per se, however, and are not discussed further now. The output signal $V_{CP}$ of the phase-frequency detector 64 is supplied to what is known as the loop filter 65 (LF). This loop filter 65 essentially determines the bandwidth of the PLL and, at its output, provides the control voltage $V_{CTRL}$ for the VCO 65, which closes the control loop. In a steady state, the phases of the signals $s_{PLL}$(t) and $S_{REF}$(t) are "locked" and the phases of the signals $s_{PLL}$(t) and $s_{LO}$(t) are in sync with the phase of the reference signal $s_{REF}$(t). The reference signal $s_{REF}$(t) can be generated by means of a quartz oscillator or can be generated based on a quartz oscillator signal (e.g. by means of frequency multiplication or frequency division, see e.g. FIG. 6), for example.

Figure 6:
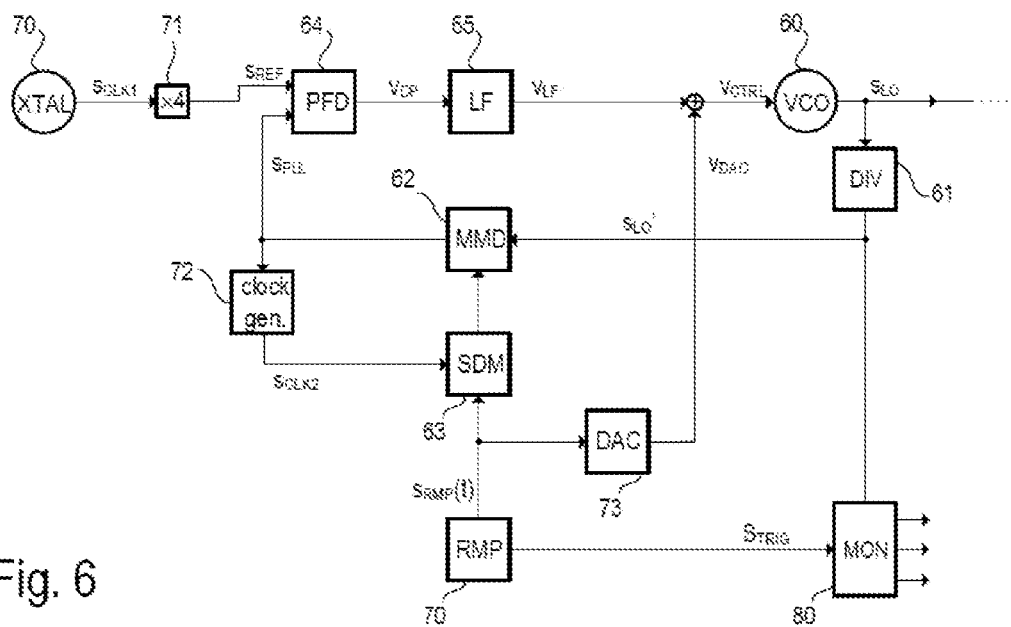
FIG. 6 illustrates an example of a phase locked loop having a monitor circuit for monitoring and testing the voltage-controlled oscillator (VCO) contained in the phase locked loop.

FIG. 6 shows a further example of a local oscillator with a VCO 60 arranged in a phase locked loop. The example is essentially the same as the previous example from FIG. 5, but has a few additional components. The reference signal $s_{REF}$(t) is generated in the present example by virtue of the oscillator signal $s_{CLK1}$(t) of a reference oscillator 70 (e.g. a crystal oscillator) being supplied to a frequency multiplier 71. The output signal of the frequency multiplier 71 is the reference signal $s_{REF}$(t). The frequency multiplier factor of the frequency multiplier 71 is 4 in the present example. In other exemplary embodiments, however, larger or smaller factors can be used. Moreover, FIG. 6 depicts the clock generator 72, which takes the PLL clock signal $s_{PLL}$ (output signal of the MMD 62) as a basis for generating a clock signal for the sigma-delta modulator 63. In addition to the example from FIG. 5, the phase locked loop shown in FIG. 6 also has a digital-to-analog convertor (DAC) 73, which is connected between the output of the ramp generator 70 and the output of the loop filter 65. The DAC 73 can be used to directly influence the control voltage $V_{CTRL}$ for the VCO 60, as a result of which it is possible for very large sudden frequency changes to be dealt with. Otherwise, the example from FIG. 6 is the same as the previous example from FIG. 5, and reference is made to the explanations above.

The frequency modulation of the transmission signal $s_{RF}$(t), which is consistent with the amplified LO signal $s_{LO}$(t), depicted by way of example in FIG. 2 can be accomplished by means of what is known as a ramp generator 70 (RMP, see FIG. 5), for example, which is configured to generate sequences of divisors that are supplied to the fractional N divider (MMD 62 and modulator 62). Variation of the (effectively non-integer) divisor N varies the frequency $f_{LO}$ of the LO signal $s_{LO}$(t) accordingly. The ramp generator 70 is configured to control the PLL, by varying the effective divisor of the MMD 62, such that the LO signal has the desired frequency modulation, i.e. the desired starting and stopping frequency, the desired chirp duration and the desired timing (cf. FIG. 2). To monitor the LO signal $s_{LO}(t)$, the output of the frequency divider 61 (constant division ratio 1/M) has a monitoring circuit 80 (MON) coupled to it. The LO signal $s_{LO}(t)$ is thus monitored indirectly by virtue of the frequency $f_{LO}'$ of the frequency-divided oscillator signal $s_{LO}'(t)$ being analyzed. The monitoring circuit is configured to generate a measured value for the frequency $f_{LO}$. The time control of the monitoring circuit 80 may be in sync with the time control of the ramp generator 70 (synchronization signal $S_{TRIG}$). In the present exemplary embodiments, the monitoring circuit 80 is integrated in the same MMIC as the RF front end 10, both simplifying tests at the end of the production line (end-of-line tests) and allowing monitoring (self-tests) during the operation of the radar sensor. The operation of the monitoring circuit 80 is explained in more detail below on the basis of examples.

Figure 7:
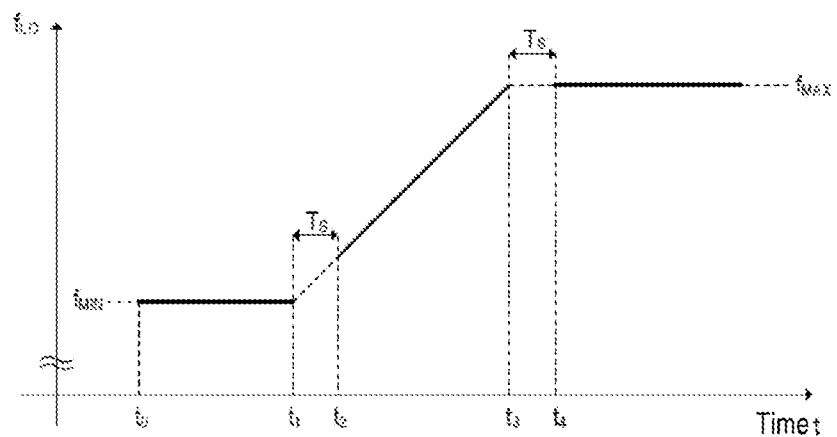
FIG. 7 uses a timing diagram to illustrate a frequency ramp and the evaluated time intervals.

The timing diagram from FIG. 7 shows the profile of the frequency $f_{LO}$ and of the frequency $f_{LO}'(t)$ during a frequency ramp by way of example. Between the times $t_0$ and $t_1$, a minimum oscillator frequency is set ($f_{LO}=f_{MIN}$); between the times $t_1$ and $t_3$, the oscillator frequency rises linearly to a maximum oscillator frequency ($f_{LO}=f_{MAX}$). After the time $t_3$, the oscillator frequency remains constant at $f_{MAX}$. An exact frequency measurement may require a settling time $T_S$ to be waited between the times $t_1$ and $t_2$ and also $t_3$ and $t_4$ before the measurement is begun.

Figure 8:
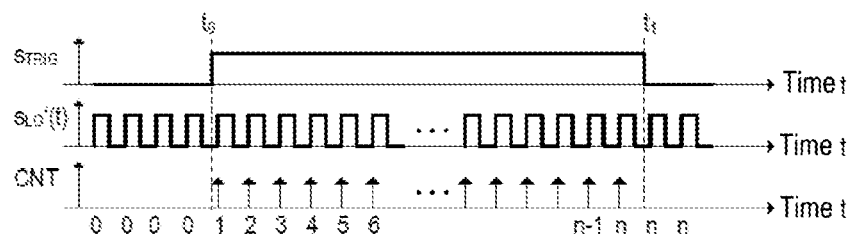
FIG. 8 uses timing diagrams to illustrate the frequency determination of the LO signal by means of counters.

The timing diagrams from FIG. 8 illustrate the frequency measurement performed by the monitoring circuit 80. A measurement is performed during a measurement time interval $T_M$ (time window) that is synchronized to a specific frequency ramp by means of the synchronization signal $S_{TRIG}$. The synchronization signal $S_{TRIG}$ is generated by the ramp generator 70 and is supplied to the monitoring circuit 80. The monitoring circuit 80 can detect the desired time window from a defined logic level (e.g. a high level) of the signal $S_{TRIG}$, for example (see top diagram in FIG. 8). The middle diagram in FIG. 8 shows the frequency-divided oscillator signal $s_{LO}'(t)$. The monitoring circuit 80 is configured to count the cycles (e.g. on the basis of the rising or falling edges) of the signal $s_{LO}'(t)$ during the time window $T_M$. The average signal frequency during the time window $T_M$ can then be computed according to $CNT/T_M$, CNT representing the count at the end of the time window $T_M$ (see bottom diagram in FIG. 8). The average frequency $f_{LO}$ can be inferred by multiplying the ratio $CNT/T_M$ by the divisor value M (and possibly by the optional divisor value x, see FIG. 9), which is constant during operation.

Figure 9:
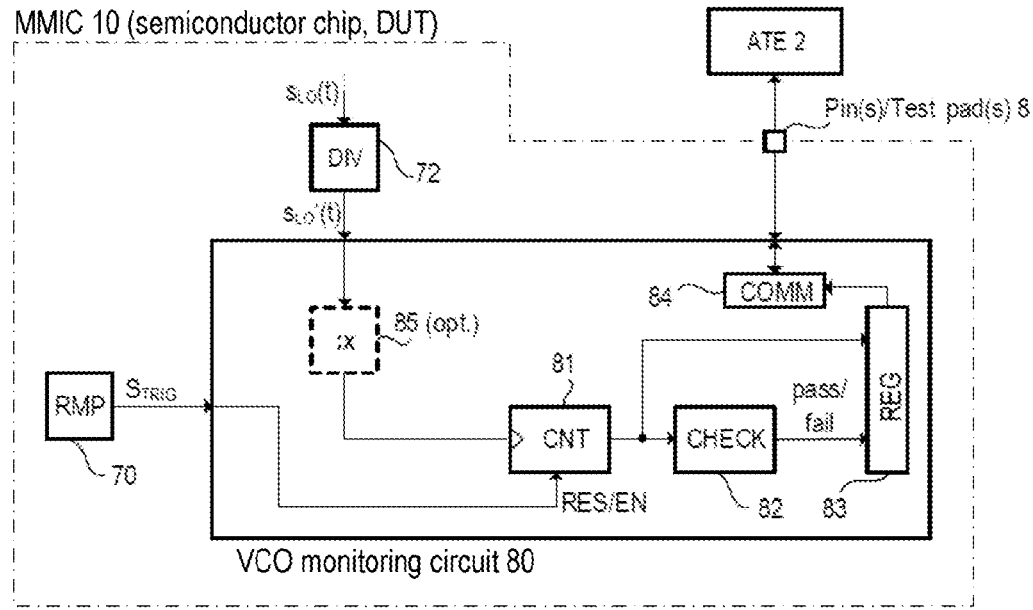
FIG. 9 illustrates an exemplary implementation of the monitor circuit from FIG. 6.

FIG. 9 illustrates an example of a monitoring circuit 80 that is configured to implement the frequency measurement outlined in FIG. 8. FIG. 9 also shows by way of example how an automatic test apparatus 2 (ATE, automatic test equipment) can be connected to the MMIC 1 in which the monitoring circuit 80 is integrated, in order—for example as part of a test at the end of the production line (end-of-line test, EOL test)—to read measured values for the frequency $F_{LO}$. The ATE 2 may also be configured to take the measured values read for $f_{LO}$ as a basis for calibrating the VCO 60 (cf. FIG. 6), for example. In this regard, the parameter $k_{VCO}$ can be adjusted by means of laser fusing of lines (e.g. strip lines) on the MMIC 10, for example. Effectively, this adapts the resonant frequency (center frequency) of the VCO for a given actuating voltage.

According to the example depicted in FIG. 9, the monitoring circuit 80 comprises a counter 81 (count CNT), an evaluation unit 82, one or more registers 83 and a communication interface 84. In the present example, the counter 81 is activated and deactivated by means of the synchronization signal $S_{TRIG}$ provided by the ramp generator 70 (cf. FIG. 8, bottom diagram). By way of example, the counter 81 counts the clock cycles of the signal $s_{LO}'(t)$ only in that time window that is indicated by the signal $S_{TRIG}$. In this regard, the counter 81 can e.g. be reset and activated on a rising edge of the signal $S_{TRIG}$ and deactivated on a falling edge of the signal $S_{TRIG}$. The counter 81 can have either the signal $s_{LO}'(t)$ at the frequency $f_{LO}'$ supplied to it (output signal of the divider 72, cf. FIG. 5) or an again frequency-divided signal at a frequency $f_{LO}'/x$ (optional frequency divider 85).

After completion of the measurement (see FIG. 8, time $t_1$) at the end of the time window, the count CNT can be written to a register 83. At the same time, the count CNT is checked by the evaluation unit 82, it essentially being detected whether the count CNT is in an admissible desired range. Depending on the result of the check, the evaluation unit 82 can write a Boolean output value to a register 83 (e.g. 0/fail, 1/pass). The evaluation unit 82 can be implemented completely in hardware or (in part or in full) as software that is executed by a processor. In the case of a software implementation, the software can be executed in the system controller 50 (microcontroller, see FIG. 3), for example. The register 83 may also be arranged in the system controller 50. The ATE 2 can read the values in the registers 83 via the communication interface 84. In this regard, the ATE 2 can make contact with the MMIC 10 to be tested (DUT, device under test), for example by one or more pins or test pads 8. The communication interface 84 may likewise be part of the system controller 50 and may be configured to transmit digital data serially or in parallel. In an exemplary embodiment, the communication interface 84 is an interface based on the SPI (serial peripheral interface) standard.

Figure 10:
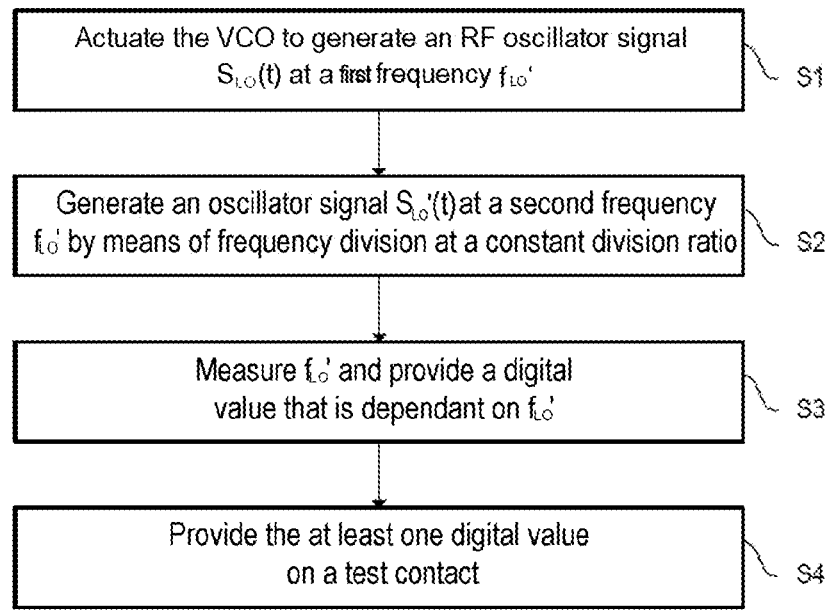
FIG. 10 is a flow chart illustrating an example of a method for testing the VCO of an RF front end.

FIG. 10 illustrates an example of a method for testing or monitoring a voltage controlled RF oscillator of a local oscillator circuit (LO circuit), such as e.g. the VCO 60 from FIG. 5 or 6, which can be used in the RF front end of a radar sensor. In the example depicted, the VCO is actuated such that it generates an RF oscillator signal $s_{LO}(t)$ at a first frequency $f_{LO}$ (see FIG. 10, step S1). The first frequency $f_{LO}$ may be (adjustably) constant or can vary (e.g. at linearly rising or falling frequency). This actuating of the VCO can be performed in different ways. By way of example, the control voltage $V_{CTRL}$ can be set directly (e.g. by means of a digital-to-analog convertor, for example using the DAC 73 shown in FIG. 6 or another DAC), so that the phase locked loop (see FIG. 5 or 6) is not active (open-loop operation of the VCO). In an exemplary embodiment, the control voltage $V_{CTRL}$ can also be generated directly by an automatic test apparatus (ATE, automatic test equipment). Alternatively, the ramp generator 70 and active phase locked loop (closed-loop mode of the VCO) can be used to generate a frequency profile (signal $s_{RMP}(t)$), for example a frequency ramp as depicted in FIG. 7.

The frequency $f_{LO}$ of the RF oscillator signal $s_{LO}(t)$ is reduced to a frequency $f_{LO}'$ (second frequency) by means of a frequency divider. That is to say that the frequency divider takes the first RF oscillator signal $s_{LO}(t)$ and generates an oscillator signal $s_{LO}'(t)$ at the second frequency $f_{LO}'$, the frequency divider operating at an (adjustably) constant division ratio 1/M (see FIG. 10, step S2). The divisor M is an integer (e.g. M=32), and the relationship $f_{LO}=M\cdot f_{LO}'$ applies. The frequency $f_{LO}'$ of the oscillator signal $s_{LO}'(t)$ at the output of the frequency divider is measured and, as a result of the measurement, at least one digital value is provided that is dependent on the second frequency $f_{LO}'$ of the oscillator signal $s_{LO}'(t)$ (see FIG. 10, step S3). The at least one digital value can, as explained with reference to FIGS. 8 and 9, comprise a counter value (cf. FIG. 9, counter 81) that represents the second frequency $f_{LO}'$ (and hence also the first frequency $f_{LO}$). Alternatively or additionally, the at least one digital value can comprise a Boolean value indicating whether the second frequency $f_{LO}'$—and hence also the first frequency $f_{LO}$—is in a desired range that is required. The at least one digital value can be provided on a test contact (e.g. test pin or test pad, see FIG. 9) (FIG. 10, step S4).

Figure 11:
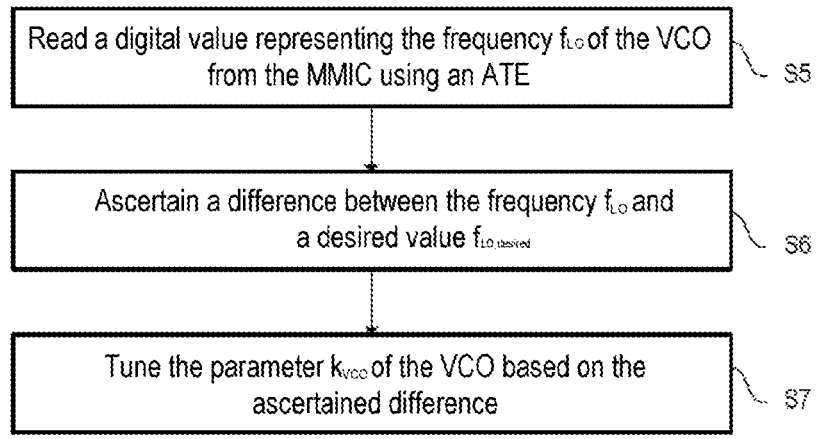
FIG. 11 is a flow chart illustrating an example of a method for automatically tuning the VCO parameter $k_{VCO}$.

Providing a measured value representing the first frequency $f_{LO}$ as a digital word (e.g. as a serial data stream) on a test contact allows comparatively simple calibration of VCO parameter $k_{VCO}$ by means of an ATE (see FIG. 9, ATE 2). In this case, the VCO is actuated at a defined voltage $V_{CTRL}$ and the resulting frequency $f_{LO}$ is measured. If the measured frequency differs from a desired value $f_{LO,desired}$ by more than a permitted difference $\Delta f$ ($f_{LO,desired} = V_{CTRL} \cdot k_{VCO}$), then the ATE can be used to adjust (tune) the parameter $k_{VCO}$ of the relevant MMIC. The aforementioned desired range for the frequency $f_{LO}$ is the range [$f_{LO,desired}-\Delta f$, $f_{LO,desired}+\Delta f$] in this case. FIG. 11 illustrates a method for automatic tuning of the VCO parameter $k_{VCO}$ performed by an ATE by way of example. In this case, the digital value representing the frequency $f_{LO}$ (or $f_{LO}'$) is read from the MMIC 10 by the ATE 2 digitally (FIG. 10, step S5), and a difference between the frequency $f_{LO}$ measured in the MMIC and an associated desired value f ascertained $f_{LO,desired}$ is (FIG. 10, step S6). Based on the ascertained difference, the parameter $k_{VCO}$ is fine-tuned (FIG. 10, step S7). The parameter $k_{VCO}$ can be tuned by adapting the length of one or more strip lines (e.g. stubs) on the MMIC 10, for example. This allows the center frequency of the VCO (and hence also the parameter $k_{VCO}$) to be tuned. Suitable techniques for this, such as e.g. fusing of strip lines, are known per se and not explained further now.

The monitor circuit shown in FIG. 9 can be used not only for the frequency measurement and the communication with an ATE, but also for self-tests during operation or during a self-test phase when the sensor is switched on. In this case, the check to determine whether the number of clock cycles counted by the counter 82 matches a desired (average) frequency is performed by the evaluation unit 82, which delivers a Boolean value (e.g. "pass" (0) or "fail" (1)) as the result. The evaluation unit 82 may, as mentioned, be embodied at least in part in software, which is executed on the system controller 50, for example. If the evaluation unit 82 indicates an erroneous frequency value ("fail"), the system controller 50 can generate an error signal that signals the error e.g. to a superordinate control unit.

Figure 12:
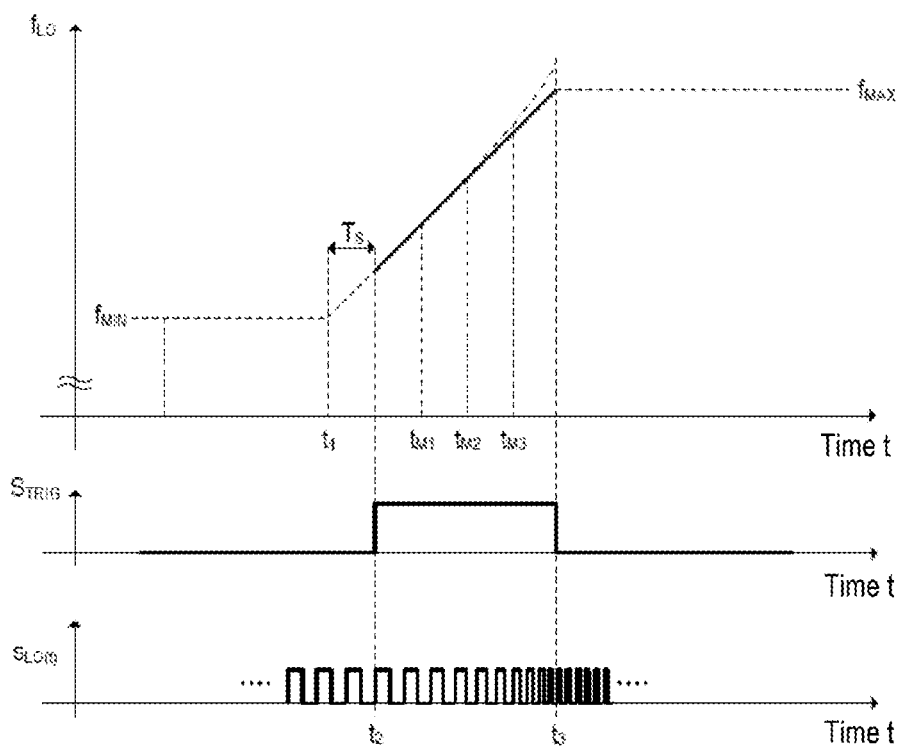
FIG. 12 uses a timing diagram to illustrate a method for testing the linearity of a frequency ramp.

The frequency measurement performed by the monitor unit 80 using the counter 81 does not necessarily have to be performed at a constant frequency $f_{LO}$ of the VCO, but rather measurements are also facilitated while the frequency $f_{LO}$ is changed, for example during a chirp pulse (frequency ramp). If multiple measurements are performed e.g. during the rise (ramp up) or fall (ramp down) of the frequency $f_{LO}$, the evaluation unit 82 can also assess the linearity of a frequency ramp. This instance of application is depicted in the timing diagrams shown in FIG. 12. The top timing diagram for FIG. 12 shows a frequency ramp as in FIG. 7, the middle timing diagram shows the synchronization signal $S_{TRIG}$ provided by the ramp generator 70 and the bottom timing diagram shows the (reduced-frequency) oscillator signal $s_{LO}'(t)$. The time window within which the counter 81 counts the cycles of the oscillator signal $s_{LO}'(t)$ begins at the time $t_2$ and ends at the time $t_3$.

In the example depicted in FIG. 12, the count of the counter 81 is read and evaluated not only at the end of the time window (time $t_3$) but also at one or more times within the time window $t_2$ to $t_3$. In the present example, the count CNT of the counter is evaluated at the times $t_{M1}$, $t_{M2}$, $t_{M3}$ and $t_3$. For each time $t_{M1}$, $t_{M2}$, $t_{M3}$ and $t_3$, the count is compared with an associated reference value, allowing improved assessment of the linearity of a frequency ramp. In the example from FIG. 12 (top diagram), the ideally linear frequency ramp is depicted as a solid line and an example of a differing real frequency ramp is depicted as a dash-dot line. It can be seen that the real frequency ramp (dash-dot line) does not substantially differ from the ideal line between the times $t_2$ and $t_{M2}$. A difference first occurs in the second portion of the time window between the times $t_{M2}$ and $t_3$ (that is to say at higher frequencies). If only a yes/no decision ("pass" or "fail") is needed, however, an evaluation at the end of the time window (i.e. after the time $t_3$) may suffice.

What is claimed is:

1. An apparatus, comprising:
   an RF oscillator configured to generate an RF oscillator signal at a first frequency;
   a frequency divider having a division ratio that is fixed during operation, to which the RF oscillator signal is supplied and which is configured to provide a second oscillator signal at a second frequency;
   a monitor circuit, to which the second oscillator signal at the second frequency is supplied and which is configured to measure the second frequency and provide at least one digital value that is dependent on the second frequency of the second oscillator signal;
   a ramp generator configured to generate a ramp signal and configured to generate a synchronization signal for the monitor circuit, the synchronization signal synchronizes a measurement of the second frequency by the monitor circuit to the generation of the ramp signal; and
   at least one test contact, on which the at least one digital value is provided.

2. The apparatus according to claim 1, wherein:
   the RF oscillator is connected in a phase locked loop.

3. The apparatus according to claim 2, wherein:
   the ramp generator is coupled to the phase locked loop such that the first frequency is adjusted according to the ramp signal.

4. The apparatus according to claim 1, wherein:
   the monitor circuit is configured to count a number of clock cycles of the second oscillator signal within a time window stipulated by the synchronization signal.

5. The apparatus according to claim 2, wherein:
   the frequency divider is connected in a feedback loop of the phase locked loop.

6. The apparatus according to claim 1, wherein:
   the RF oscillator is a voltage-controlled oscillator (VCO) or a digitally controlled oscillator (DCO).

7. The apparatus according to claim 1, wherein:
   the monitor circuit is configured to count a number of clock cycles of the second oscillator signal within a time window, and
   the monitor circuit is configured to check whether the number of clock cycles is in a desired range.

8. The apparatus according to claim 7, wherein:
   the at least one digital value comprises at least one of the following:
   a Boolean value indicating whether the counted number of clock cycles is in the desired range; and a digital word representing the counted number of clock cycles.

9. The apparatus according to claim 8, further comprising: a communication interface configured to make the digital word available as a serial or parallel data stream on the at least one test contact.

10. The apparatus according to claim 1, wherein the frequency divider is a fixed frequency divider and the division ratio is fixed at a constant value throughout a generation of the ramp signal via the ramp generator.

11. The apparatus according to claim 10, wherein: the synchronization signal defines a measurement time interval that coincides with a portion of the ramp signal selected for monitoring, wherein the measurement time interval is defined by a first transition edge of the synchronization signal and a second transition edge of the synchronization signal, and the monitor circuit is configured to enable measuring of the second frequency in response to detecting the first transition edge of the synchronization signal and disable measuring of the second frequency in response to detecting the second transition edge of the synchronization signal.

12. The apparatus according to claim 11, wherein the portion of the ramp signal selected for monitoring is a specific frequency ramp of the ramp signal.

13. The apparatus according to claim 12, wherein the portion of the ramp signal selected for monitoring is defined by a minimum oscillator frequency and a maximum oscillator frequency of the specific frequency ramp.

14. The apparatus according to claim 11, wherein the monitor circuit is configured to calculate an average value of the second frequency measured during the measurement time interval, and convert the average value of the second frequency into an average value of the first frequency.

15. The apparatus according to claim 11, wherein the monitor circuit is configured to count a total number of clock cycles of the second oscillator signal during the measurement time interval, compare the total number of clock cycles to a tolerance range to determine whether the total number of clock cycles are within or outside the tolerance range, and generate a digital value based on whether the total number of clock cycles is within or outside the tolerance range.

16. The apparatus according to claim 15, wherein the monitor circuit includes a counter that is configured to count the total number of clock cycles of the second oscillator signal during the measurement time interval, wherein the counter is activated in response to the first transition edge of the synchronization signal and deactivated in response to the second transition edge of the synchronization signal.

17. The apparatus according to claim 11, wherein the monitor circuit is configured to count a total number of clock cycles of the second oscillator signal during the measurement time interval, and generate a digital value representative of the total number of clock cycles of the second oscillator signal.

18. A method, comprising:
actuating an RF oscillator such that the RF oscillator generates an RF oscillator signal at a first frequency;
generating a second oscillator signal at a second frequency from the first RF oscillator signal using a frequency divider having a division ratio that is fixed during operation;
generating a ramp signal;
generating a synchronization signal;
measuring the second frequency based on the synchronization signal and the ramp signal, wherein the synchronization signal synchronizes the measuring of the second frequency to the ramp signal;
providing at least one digital value that is dependent on the measured second frequency of the second oscillator signal; and
providing the at least one digital value on a test contact.

19. The method according to claim 18, wherein providing the at least one digital value comprises: checking whether the measured second frequency is consistent with a desired value or differs from the desired value by less than a maximum permitted difference, wherein the at least one digital value indicates the result of the check.

20. The method according to claim 18, wherein: the first frequency and the second frequency vary during the measuring.

21. The method according to claim 18, wherein: the first frequency and the second frequency rise or fall in accordance with a defined frequency ramp, and a time window in which the second frequency is measured is in sync with the frequency ramp.

22. The method according to claim 18, wherein measuring the second frequency comprises: counting a number of clock cycles of the second oscillator signal during a time window; and storing the number of clock cycles counted up to an end of the time window.

23. The method according to claim 18, wherein measuring the second frequency comprises: counting a number of clock cycles of the second oscillator signal during a time window; and storing, for at least one measurement time before expiry of the time window, the number of clock cycles counted up to a respective measurement time.

24. The method according to claim 23, wherein providing the at least one digital value comprises: comparing the number of clock cycles stored for the at least one measurement time with at least one corresponding reference value; and generating the at least one digital value on the basis of a result of the comparison.

25. The method according to claim 18, further comprising: adjusting a device parameter of the RF oscillator, on which a value of the first frequency generated by the RF oscillator depends for a given actuation, on a basis of the at least one digital value.

26. The method according to claim 25, wherein: adjusting the device parameter comprises adapting of a line length by fusing.

27. The method according to claim 25, wherein adjusting the device parameter comprises: ascertaining a difference between the first frequency and a desired value; and adjusting the device parameter on a basis of the ascertained difference.

28. A monolithic microwave integrated circuit (MMIC), comprising:
an RF oscillator, integrated in a semiconductor chip, configured to generate an RF oscillator signal at a first frequency;
a frequency divider, integrated in the semiconductor chip, having a division ratio that is fixed during operation, to which the RF oscillator signal is supplied and which is configured to provide a second oscillator signal at a second frequency;

a monitor circuit, integrated in the semiconductor chip, to which the second oscillator signal at the second frequency is supplied, which is configured to measure the second frequency, and which is configured to provide at least one digital value that is dependent on the second frequency of the second oscillator signal;

a ramp generator, integrated in the semiconductor chip, configured to generate a ramp signal and configured to generate a synchronization signal for the monitor circuit, the synchronization signal synchronizes a measurement of the second frequency by the monitor circuit to the generation of the ramp signal; and at least one test contact, arranged on the semiconductor chip, on which the at least one digital value is provided.

* * * * *